July 11, 1967 N. J. MILLER 3,331,032
VOLTAGE CONTROLLED OSCILLATOR OPERATIVE IN THE MONOSTABLE, ASTABLE OR GATED MODE
Filed March 15, 1966
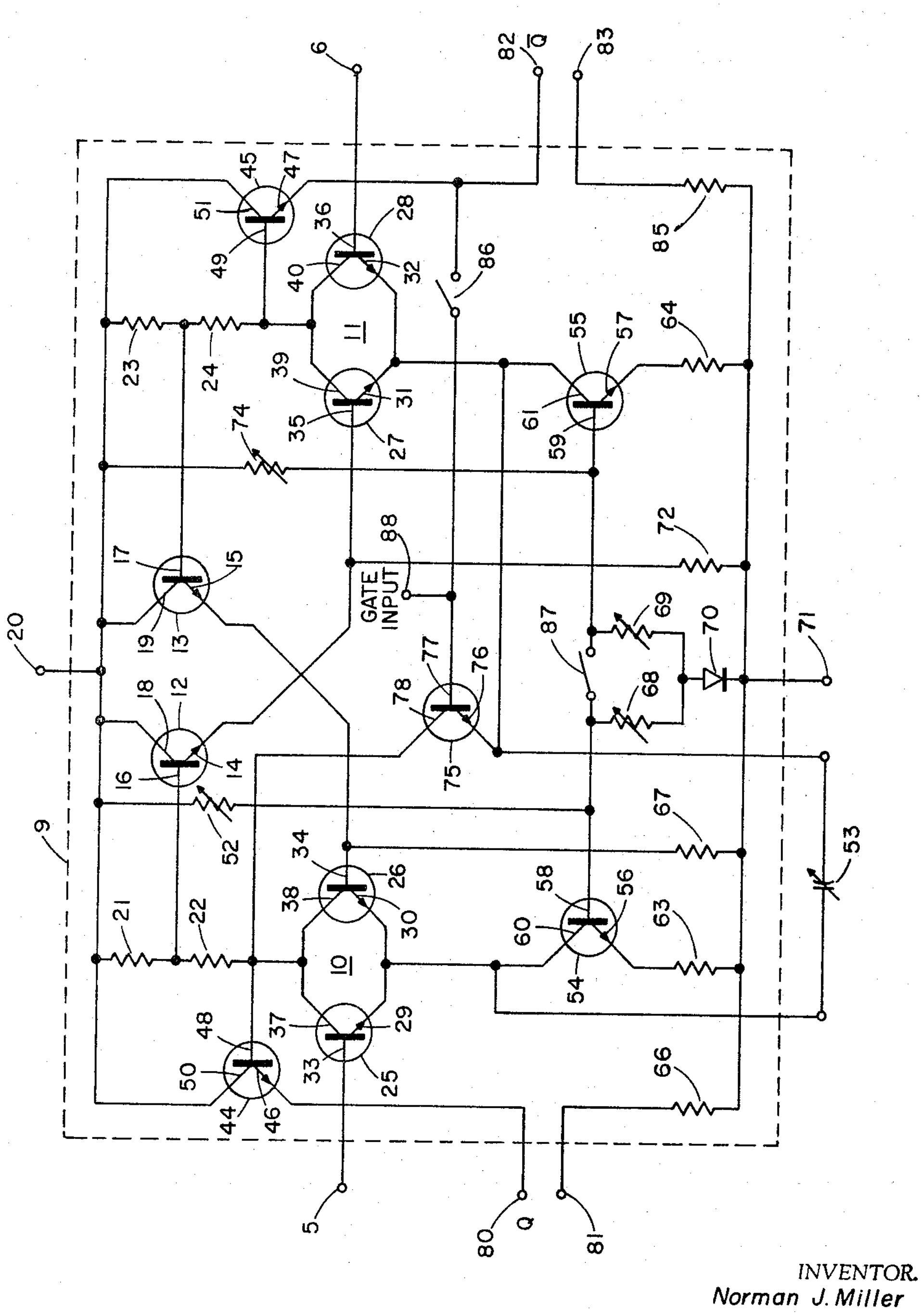
INVENTOR.
Norman J. Miller
BY
Mueller, Aichele & Rauner
ATTY'S.

3,331,032

VOLTAGE CONTROLLED OSCILLATOR OPERATIVE IN THE MONOSTABLE, ASTABLE OR GATED MODE

Norman J. Miller, Geneva, Switzerland, assignor to Motorola, Inc., Franklin Park, Ill., a corporation of Illinois Filed Mar. 15, 1966, Ser. No. 534,348
10 Claims. (Cl. 331—113)

ABSTRACT OF THE DISCLOSURE

A voltage controlled oscillator operative in the monostable, astable or gated mode having first and second leveling shifting transistors cross-coupled respectively to first and second holding transistors with one or the other of the holding transistors conducting in each of the two stable states of the oscillator. The first and second holding transistors are connected in parallel respectively with first and second input transistors to form a pair of parallel connected transistors on each side of the oscillator, and the input transistors are connectable to a source of triggering voltage for changing the conductive state of the oscillator. First and second current source transistors are connected respectively between the pairs of parallel connected transistors and a voltage supply terminal, and these current source transistors establish a constant current through the first and second holding transistors as the oscillator is switched from one to the other of its two conductive states. A gating transistor is connected between the two transistor pairs and is asynchronously controllable by a gate voltage applied thereto. An external capacitor is also connected between the two transistor pairs and charged in first one and then another direction as the oscillator is switched from one to the other of its two conductive states.

The present invention relates generally to oscillators and more particularly to a new and improved oscillator which may be operated either as a free running multivibrator, a gated oscillator, a voltage controlled oscillator or a monostable multivibrator. There is no oscillator presently known which is so versatile and capable of operating in as many modes as the oscillator according to the present invention. Notwithstanding the versatility of the invention, it may be constructed using a minimum number of integrated circuit components.

Presently known multivibrators include complementary cross-coupled, like-conductivity transistors in combination with other symmetrically connected circuit components and arranged in a particular circuit configuration in order to provide either astable (free running) switching action or monostable (one-shot) switching action. However, separate and distinct circuits are normally required for each type of multivibrator switching action, and major modifications to individual circuit configurations are required in order to change from one mode of switching operation to another mode of switching operation.

The present invention has been designed to overcome the disadvantages in the requirement for a separate circuit for each type of switching action required. The present invention includes a multivibrator which may be of discrete component or integrated circuit construction and in which the above described types of switching action may be achieved without the necessity of substantially modifying the particular circuit arrangement embodied by the present invention. Additionally, the duty cycle of the multivibrator according to the invention can be easily varied for either free running or monostable switching operation. This may be accomplished simply by varying the resistors which control the current drawn by a pair of current source transistors in the multivibrator circuit, and wide ranges of duty cycle can be implemented without employing complex electronic circuitry. This not only saves components which are usually necessary to initiate fast discharging of the multivibrator timing network, but it also minimizes the physical size of a timing capacitor in the timing network.

It is an object of the present invention to provide a new and improved oscillator, the frequence of which can be easily controlled.

It is another object of the invention to provide a new and improved oscillator, the duty cycle of which can be easily controlled and which is not affected by the changes in frequency of oscillation of the oscillator or the control voltage producing the variations in oscillation frequency.

It is another object of the invention to provide a new and improved oscillator, the frequency and duty cycle of which are only slightly affected by power supply variations.

It is a further object of the invention to provide a new and improved oscillator in which a wide frequency variation may be easily achieved.

It is still a further object of the invention to provide a new and improved oscillator having flexible power supply and logic swing requirements.

It is still a further object of the invention to provide a new and improved oscillator, the output signal of which may be phase and frequency controlled by the application of gating signals thereto.

Yet another object of the invention is to provide a new and improved oscillator of the type described which may be operated as a monostable multivibrator with very high duty cycles by making only a slight modification to the circuit configuration of the oscillator when connected in its free running and/or gated mode.

A feature of the invention is the provision of a pair of complementary cross-coupled, like conductivity transistors and an output transistor coupled to each of the cross-coupled transistors for providing one of two possible output logic levels depending upon the high or low conductive state of the cross-coupled transistors. Emitter coupled transistor pairs are connected respectively to the cross-coupled complementary transistors and these transistor pairs are connectable to a source of control voltage for varying the frequency at which the complementary cross-coupled, like-conductivity transistors change their conductive states. A current source transistor is connected between each of the transistor pairs and a source of supply voltage and provides a current path from the complementary cross-coupled transistors through the respective emitter-coupled transistor pairs to the source of supply voltage.

Another feature of the invention is the provision of a capacitor between the respective emitter-coupled transistor pairs; the charging and discharging of the capacitor provides either astable or monostable switching of the cross-coupled complementary transistors depending upon the absence or presence of a feedback connection between the output of the oscillator and the capacitor.

Another feature of the invention is the provision of a transistor gate connected between the respective emitter-coupled transistor pairs and connected to the capacitor for varying the charge and discharge times of the capacitor thereby varying the frequency of oscillation of the oscillator when the oscillator is connected for monostable operation. The transistor gate is connected in the feedback connection and the conductive state thereof is controlled by the oscillator output signal.

These and other objects and features will become more fully apparent in the following description of the invention which is illustrated in a single embodiment in the accompanying drawing.

Briefly described, the oscillator according to the invention comprises first and second complementary cross-coupled transistors connected for alternate switching between high and low conductive states. First and second output transistors are connected respectively to the first and second complementary cross-coupled transistors, and first and second emitter-coupled transistor pairs are connected respectively to the first and second complementary cross-coupled transistors. Each transistor pair is adapted to receive a control voltage for either changing the frequency of oscillation of the first and second complementary transistors or for initiating monostable switching action for the oscillator. First and second current sources are connected respectively between the first and second emitter-coupled transistor pairs and a source of supply voltage. These current sources provide a current path from one of the emitter-coupled transistor pairs to the supply voltage, depending upon which one of the first and second cross-coupled transistors is in a high conductive state. A capacitor is connected between the emitter-coupled transistor pairs and is also connected to a transistor gate for control thereby when the oscillator is operated in a gating mode. The oscillator may be gated in its astable mode by the application of gating signals to the transistor gate. If, however, monostable switching is desired, an oscillator output signal is fed back to the input of the transistor gate by the closure of a feedback connection. The oscillator frequency may be controlled either by (1) varying the capacitor connected between the emitter-coupled transistor pairs, (2) by changing the control voltage at one of the emitter-coupled pairs or (3) by changing the frequency of a gating signal applied to the transistor gate. In addition to varying the frequency of the oscillator, gating signals applied to the gate transistor will cause the oscillator to become phase locked with the phase of the gating signals.

Referring in detail to the accompanying drawing, there is shown a pair of like-conductivity, level shifting transistors 12 and 13. These complementary transistors 12 and 13 are cross-coupled as shown in order to provide a level of voltage shift equal to their emitter-base offset voltages between resistors 21 and 23 and the bases 34 and 35 of a pair of alternately conducting holding or latchback transistors 26 and 27, respectively. These transistors are referred to as holding or latchback transistors since they conduct and hold the flip-flop in one of its two stable states in the absence of triggering or gating pulses applied to the oscillator. In operation, transistors 12 and 13 are never completely turned off, but rather are switched from a high to a low conducting state and vice-versa.

The emitters 14, 15 of the two cross-coupled NPN transistors 12 and 13 are connected to the bases 34, 35 of transistors 26 and 27 in the emitter-coupled holding transistor control means 10 and 11, respectively. The bases 16, 17 of the cross-coupled transistors 12 and 13 are connected to the center tap of voltage divider resistors 21, 22 and 23, 24, respectively. Resistors 21 and 23 of the voltage dividers and collectors 18, 19 of the cross-coupled transistors 12 and 13 respectively are connected to a point 20 of reference or positive bias potential.

First and second output circuit means including first and second output transistors 44 and 45 are connected at the respective bases 48, 49 thereof to the collectors 37, 38 and 39, 40 of the emitter-coupled transistor control means 10 and 11, and the collectors 50, 51 of the output transistors 44 and 45 are connected to the point 20 of reference or bias potential. The emitters 46, 47 of output transistors 44 and 45 are connected to the output terminals 80 and 82.

The emitter-coupled transistor control means 10 and 11 include voltage controlled transistors 25 and 28 respectively, the emitters 29, 32 of which are connected to the collectors 60, 61 of a pair of current source transistors 54 and 55. The voltage controlled transistors 25 and 28 are connectable at terminals 5 and 6 respectively to sources of variable control potentials. However, since it is necessary to apply a control voltage to only one of the transistors 25 or 28 in the emitter-coupled transistor pairs to vary the oscillator frequency, the other transistor 25 or 28 is used for receiving a triggering signal to initiate monostable or one shot operation in the oscillator circuit.

The emitters 56, 57 of the current source transistors 54 and 55 are resistively coupled at 63 and 64 to a point 71 of negative potential, and output resistors 66 and 85 are connected between the source of negative potential 71 and output terminals 81 and 83. The input and output impedances are connected between Q terminals 80, 81 and $\overline{Q}$ terminals 82, 83, and load resistors 66 and 85 may be omitted if desired. First and second bias resistors 67 and 72 are connected between the bases 34, 35 of holding transistors 26 and 27 and a point of negative potential 71, and third and fourth bias resistors 68 and 69 are connected between the bases 58, 59 of current transistors 54 and 55 and the point 71 of negative potential. The resistors 68 and 69 may be adjustable in order to provide a flexible and separate bias adjustment for the base voltages of transistors 54 and 55, and this will enable the current source transistors 54 and 55 to draw a variable current from transistors 26 and 27. A temperature compensating diode 70 is connected between the third and fourth bias resistors 68 and 69 and the point 70 of negative potential. If desired, switch 87 may be closed to cut out the series resistance between transistor bases 58, 59 and to reduce the emitter-bias resistance of current source transistors 54 and 55.

A first duty cycle control resistor 52 is connected between the base 58 of current source transistor 54 and the point 20 of reference or bias potential, and a second duty cycle control resistor 74 is connected between the base 59 of current source transistor 55 and the point 20 of reference or bias potential. In operation, either resistors 52, 74, 68 or 69 may be varied to change the duty cycle of the oscillator since the oscillator duty cycle is equal to the ratio of currents flowing in transistors 54 and 55.

A variable capacitor 53 is connected between the junction of emitters 29, 30 in the transistor control means 10 and the junction of emitters 31, 32 in the transistor control means 11. The capacitor 52 is normally connected external to the remaining portions of the oscillator circuit when the oscillator circuit is formed on a single chip 9 in a monolithic integrated circuit.

A transistor gate 75 is connected at the collector 78 thereof to the junction of collectors 37, 38 of the emitter-coupled transistor pair 25 and 26. The emitter 76 of transistor gate is connected to one side of capacitor 53 and is also connected to the junction of emitters 31, 32 of the emitter-coupled transistor pair 27 and 28.

Before proceeding to the operation of the oscillator according to the invention, it should be emphasized that the word "connected" as used hereinabove is intended to include integrated circuits in which like-conductivity semiconductors are integrally formed with each other in a monolithic integrated circuit. For example, the collector 78 of the gate transistor 75 which is an N-type conductivity material may be integrally formed with collectors 37, 38 of the emitter-coupled transistor pair 25 and 26. Likewise, the emitters 29, 30 and 31, 32 may be integrally formed respectively with the N-type collectors 60 and 61 of the current source transistors 54 and 55.

The operation of the present invention will be discussed in the following four separate sections:

(1) The astable multivibrator,
(2) The voltage controlled oscillator,
(3) The gated oscillator,
(4) And the monostable multivibrator.

I.—THE ASTABLE MULTIVIBRATOR

In order to understand the operation of the oscillator according to the present invention when connected as a free running multivibrator (switch 86 open) and with no gating signal applied to the base 77 of transistor gate 75, assume that transistor 12 has just been switched into a high conductive state and that transistor 13 is a low conductive state. With transistor 12 in a high conductive state, current will flow into the base 35 and emitter 31 of holding transistor 27. From the emitter 31, the current will divide between the current source transistor 55 and the coupling capacitor 53. In this condition, the center tap of voltage divider resistors 23, 24 will not be sufficiently high to forward bias the emitter-base junction of holding transistor 26.

As the current from emitter 31 begins to charge capacitor 53, the voltage at the junction of emitters 29, 30 of the emitter-coupled transistor pair 25 and 26 will eventually fall to one diode drop below the base 34 potential of holding transistor 26. When this happens, transistor 26 is biased into conduction and an increase in current flow in resistor 21 of the voltage divider 21, 22 will lower the voltage at the base 16 of transistor 12. This voltage drop will revert transistor 12 to its state of low conduction and this voltage drop will be coupled to the base 35 of holding transistor 27, turning off transistor 27. When transistor 27 turns off, the voltage at the mid-point of voltage divider 23, 24 will be increased and transistor 13 will be driven into a state of high conduction. With the voltage at the base 17 of transistor 13 increased, transistor 26 will be driven into even higher conduction and transistor 27 will be completely turned off.

At this point, current flowing from the emitter 30 begins to charge capacitor 53 in the opposite direction and the cycle begins to repeat itself as emitter 31 of transistor 27 falls to one diode drop below base 35, rendering transistor 27 conducting again.

The frequency of oscillation of the oscillator described above depends upon the value of the external capacitor 53 connected between the emitter junctions of the emitter-coupled transistor control means 10 and 11. When using the component values given in the table below and varying the capacitance of capacitor 53 from near zero to approximately 975 picofarads, the oscillator frequency range was found to extend from approximately 100 megacycles to approximately 1.5 megacycles.

The following is a table of values for the various circuit components used in one multivibrator circuit according to the invention which has been successfully operated.

*Table I*

| Components: | | Value |
|---|---|---|
| Transistors 12, 13, 25, 26, 27, 28, 54, 55 and 75 | | NPN |
| Resistor 21 | ohms | 100 |
| Resistor 22 | do | 100 |
| Resistor 23 | do | 100 |
| Resistor 24 | do | 100 |
| Resistor 52 | kilohms | 2–100 |
| Resistor 63 | ohms | 200 |
| Resistor 64 | do | 200 |
| Resitsor 66 | do | 500 |
| Resistor 67 | kilohms | 2 |
| Resistor 68 | ohms | 400 |
| Resistor 69 | do | 400 |
| Resistor 72 | kilohms | 2 |
| Resitsor 74 | do | 1.6 |
| Resistor 85 | ohms | 500 |

However, it should be understood that the above component values are only exemplary of one embodiment of the invention actually built and tested, and these values should not be construed as limiting the scope of the invention.

The duty cycle of the oscillator can be varied by changing the ratio of resistors 52 and 74, and this duty cycle is not affected by the frequency of oscillation of the astable multivibrator.

The output pulse amplitude at the output terminals 80 and 82 varies almost linearly with variations in the supply voltage at terminal 71. However, the duty cycle and the frequency of the oscillator vary by only a small percentage with variations in the supply voltage.

II.—THE VOLTAGE CONTROLLED OSCILLATOR

By varying the voltage level at either base electrode 33 or base electrode 36 of transistors 25 and 28 respectively, the rate of current flow into capacitor 53 may be easily controlled. This feature of the present invention enables a frequency variation with control voltage of greater than 1.5 to 1. Using a capacitor 53 equal to 2,000 picofarads and by increasing the voltage at the base 33 of transistor 25 from approximately −1.6 to approximately −0.9 volt, the frequency of oscillation of the circuit was increased from approximately .91 megacycle to approximately 1.65 megacycles. Using a 150 picofarad capacitor 53 and by varying the control voltage at the base 33 of transistor 25 from approximately 1.55 volts to approximately 0.85 volt, the frequency of oscillation of the circuit was increased from approximately 9.5 megacycles to a value greater than 14 megacycles. In another test run, using a 30 picofarad capacitor 53 and varying the control voltage at the base 33 of transistor 25 from −.8 to −1.6 volts, the frequency of oscillation of the circuit was increased from a value less than 28 megacycles to a value greater than 32 megacycles. It should be noted however that these variations in control voltage at base 33 of transistor 25 have negligible effect on the duty cycle of the oscillator.

III.—THE GATED OSCILLATOR

When using the oscillator according to the invention as a gated oscillator, the circuit provides a series of output pulses phased to the gating pulse. The voltage control feature discussed above is also useful in the gated oscillator circuit to vary the frequency of the output oscillation while the frequency of the gating pulse at the base 77 of the gate transistor 75 remains constant. And the gating pulse at the base 77 of the transistor gate 75 has no effect on the duty cycle of the oscillator.

When gating pulses are applied at terminal 88 to the base 77 of the transistor gate 75, the capacitor 53 will be charged and discharged at a rate proportional to the level of the gating pulse. By controlling the charge and discharge times of capacitor 53, the oscillator can be phase locked to the gating pulse at the base 77 of the transistor gate 75.

IV.—THE MONOSTABLE MULTIVIBRATOR

When the oscillator circuit according to the invention is to be operated as a monostable multivibrator, the switch 86 is closed, connecting the base 77 of the transistor gate 75 to the output terminal 82 and emitter 47 of the output transistor 45. The monostable switching action of the oscillator circuit may be explained as follows: Assume that the monostable state of the multivibrator is when transistor 12 is in a low conducting state and when transistor 13 is in a high conducting state. Under these given conditions, the midpoint between resistors 23 and 24 is at a sufficiently high potential to maintain the emitter-base junction of transistor 26 forward biased into conduction. With no current flowing through resistor 23, the output terminal 82 and the base 77 of the gate transistor 75 are at approximately −0.8 volt if terminal 20 is at ground potential. Transistor 27 is off and current is flowing from the emitter 15 into the base 34 of transistor 26.

If now a positive set pulse is applied at terminal 6 to the base electrode 36 of transistor 28, transistor 28 will conduct and thus cause the voltage at the base 17 of transistor 13 to be lowered to a value which is insufficient to maintain transistor 26 conducting. Transistor 26 now begins to turn off, causing the voltage at the midpoint of resistors 21 and 22 to be raised, and this biases transistor 12 for higher conduction. With transistor 12 in a high conducting state, current will flow into the base 35 of transistor 27, further lowering the voltage at the collectors 39 and 40 of the emitter-coupled transistor pair 27 and 28 and in turn causing the emitter follower output transistor 45 to produce a negative output pulse. With switch 86 closed, this negative output is coupled to the base 77 of the transistor gate 75 and prevents the transistor gate 75 from discharging capacitor 53. When the emitter 30 of transistor 26 drifts down to 0.8 volt below the base, transistor 26 starts to turn on. With transistor 26 conducting, the voltage at the base 16 of transistor 12 is again lowered, biasing transistor 12 to a low conducting state and turning transistor 27 off. Transistor 13 will again be switched into high conduction to complete the monostable switching action. Transistor 13 will remain in a high conducting state until another positive pulse is applied to the base electrode of transistor 28. If the set pulse applied at terminal 6 to the base 36 of switching transistor 28 is longer than the desired output pulse at terminal 82, a differentiating network may be used between the source of set pulses and the base 36 of switching transistor 28.

In actual operation, the monostable multivibrator described above provides a constant output pulse amplitude and a pulse width which varies from 30 to 500 nanoseconds as the frequency is varied from 50 megacycles to 0.1 megacycle. In order to trigger the monostable multivibrator at all frequencies, a minimum pulse width of approximately 20 nanoseconds and pulse height of approximately 0.3 volt is required for a bias level at the base 36 of transistor 28 of approximately −1.5 volts.

It should be emphasized again, however, that the particular input terminal 5 or 6 to which a control voltage or monostable triggering pulse is applied is purely a matter of choice.

Power supply variations have little effect on the duty cycle, the total output pulse time or the pulse width of the multivibrator.

Thus, the invention described above is a highly versatile oscillator circuit capable of astable and monostable switching action without the necessity of substantially modifying the circuit configuration disclosed. The oscillator circuit according to the invention is quite stable up to 75 megacycles and will still operate at 100 megacycles. A frequency variation of greater than 1.5 to 1 can be achieved merely by varying a control voltage input to the oscillator terminal 5 or 6 and this is a major advantage of the circuit when compared to a frequency variation of a very small percentage in standard, presently known devices.

I claim:

1. An oscillator comprising, in combination:

(a) bistable means including first and second level shifting transistors cross-coupled respectively to first and second pairs of parallel connected control transistors, said control transistors including a holding transistor in one pair driven by current from one of the level shifting transistors when said oscillator is in one of its two conductive states and a holding transistor in the other pair driven by current from the other level shifting transistor when said oscillator is switched to the other of its two conductive states;

(b) first and second impedance means connected respectively to said first and second level shifting transistors and further connected between a point of reference potential and said first and second pairs of control transistors for providing a current path to said first and second pairs of control transistors respectively, the other transistor in each pair of control transistors connectable to a source of switching voltage and adapted to become biased into conduction and draw current through one of said first and second impedance means respectively to thereby change the conductive state of the oscillator; and (c) first and second current sources connected respectively between said first and second pairs of control transistors and a voltage supply terminal, said first and second current sources providing first and second paths for constant current from a holding transistor in either said first pair of control transistors or said second pair of control transistors when said oscillator is stable in one of its two conductive states.

2. The oscillator according to claim 1 which includes a capacitor connected between said first and second pairs of control transistors and continuously charging in opposite directions as said first and second level shifting transistors alternately change from high to low conductive states.

3. The oscillator according to claim 2 wherein said first and second current sources each include a current source transistor having emitter, base and collector electrodes, one of said emitter and collector electrodes of said current source transistors connected to said first and second pairs of control transistors and the other of said emitter and collector electrodes of said current source transistors connected to said voltage supply terminal.

4. The oscillator according to claim 2 which further includes:

(a) a transistor gate connected between said first and second pairs of control transistors and to said capacitance means and adapted to receive a gating voltage to control the phase and the frequency of oscillation of said oscillator, (b) a first duty cycle control resistor connected between said first current source and said point of reference potential, and (c) a second duty cycle control resistor connected between said second current source and point of reference potential, the duty cycle of the alternate conduction of said first and second level shifting transistors being dependent upon the ratio of said first duty cycle control resistor to said second duty cycle control resistor.

5. The oscillator according to claim 2 wherein:

(a) each transistor in said first and second pairs of control transistors includes emitter, base and collector electrodes, said first and second level shifting transistors also having emitter, base and collector electrodes, said base electrodes of one transistor in each pair of control transistors connected respectively to one of said emitter and collector electrodes of said first and second level shifting transistors and said base electrode in the other transistor in each pair of control transistors connectable to a source of control and triggering voltage, and (b) said capacitance means charging from current flowing from one of said first and second pairs of parallel connected control transistors to a value sufficient to change the conductive state of the other of said first and second pairs of parallel connected connected control transistors, thereby varying the current flow through said impedance means associated with said other pair of said parallel connected control transistors to vary the bias on one of said level shifting transistors to change the conductive state thereof.

6. The oscillator according to claim 5 wherein said first and second current sources each include a current source transistor having emitter, base and collector electrodes, one of said emitter and collector electrodes of each of said current source transistors connected respectively to said first and second pairs of control transistors respectively and the other of said emitter and collector electrodes of each of said current source transistors connected to said voltage supply terminal.

7. The oscillator according to claim 6 which further includes:

(a) a transistor gate connected between said first and second pairs of control transistors and to said capacitance means, said transistor gate adapted to receive a gating voltage to control the phase and the frequency of oscillation of said first and second level shifting transistors, (b) a first duty cycle control resistor connected between said first current source and said point of reference potential, and (c) a second duty cycle control resistor connected between said second current source and said point of reference potential, the duty cycle of the alternate conduction of said first and second level shifting transistors being dependent upon the ratio of said first duty cycle control resistor to said second duty cycle control resistor.

8. The oscillator according to claim 7 wherein:

(a) said first impedance means includes a first voltage divider connected between said point of reference potential and said first pair of control transistors, (b) said second impedance means includes a second voltage divider connected between said point of reference potential and said second pair of control transistors, (c) said first and second voltage dividers connected respectively to base electrodes of said first and second level shifting transistors for controlling the high and low conductive states thereof in accordance with the current flow in said first and second voltage dividers, (d) first and second bias resistance means connected between said voltage supply terminal and the base electrodes of one transistor in said first and second pairs of parallel connected pairs of control transistors respectively, (e) third and fourth bias resistance means connected between said voltage supply terminal and the base electrodes of said first and second current source transistors respectively, and (f) temperature compensating diode means connected between the base electrodes of said first and second current source transistors and said source of supply voltage.

9. The oscillator according to claim 8 wherein:

(a) said parallel connected transistor pairs have the collector electrodes thereof connected respectively to said first and second voltage dividers and the emitter electrodes thereof connected respectively to opposite sides of said capacitance means, and (b) said oscillator further including a first output transistor connected to said first pair of control transistors and a second output transistor connected to said second pair of control transistors, said first and second output transistors providing first and second output voltage levels in accordance with current flow in said first and second voltage dividers.

10. The oscillator according to claim 9 which includes feedback means connecting said transistor gate to one of said first and second output transistors thereby ensuring monostable switching of said first and second level shifting transistors when a triggering signal is applied to one of said first and second pairs of control transistors.

References Cited

UNITED STATES PATENTS

| | | | |
|---|---|---|---|
| 3,061,799 | 10/1962 | Biard | 331—113 |
| 3,077,567 | 2/1963 | Gray | 331—113 |
| 3,281,715 | 10/1966 | Folz et al. | 331—113 |

ROY LAKE, *Primary Examiner.*

JOHN KOMINSKI, *Examiner.*